United States Patent
Xiang et al.

(10) Patent No.: US 10,276,094 B2
(45) Date of Patent: Apr. 30, 2019

(54) PIXEL DRIVING CIRCUIT AND DRIVING METHOD THEREFOR, AND ORGANIC LIGHT-EMITTING DISPLAY PANEL

(71) Applicants: Shanghai Tianma AM-OLED Co., Ltd., Shanghai (CN); TIANMA MICRO-ELECTRONICS CO., LTD., Shenzhen (CN)

(72) Inventors: Dongxu Xiang, Shanghai (CN); Yue Li, Shanghai (CN); Dong Qian, Shanghai (CN); Gang Liu, Shanghai (CN); Renyuan Zhu, Shanghai (CN); Tong Wu, Shanghai (CN); Zeyuan Chen, Shanghai (CN)

(73) Assignees: Shanghai Tianma AM-OLEO Co., Ltd., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 3 days.

(21) Appl. No.: 15/464,281

(22) Filed: Mar. 20, 2017

(65) Prior Publication Data
US 2017/0270853 A1    Sep. 21, 2017

(30) Foreign Application Priority Data
Dec. 19, 2016   (CN) .......................... 2016 1 1178132

(51) Int. Cl.
*G09G 3/3233*   (2016.01)
*H01L 27/32*    (2006.01)
(Continued)

(52) U.S. Cl.
CPC ......... *G09G 3/3233* (2013.01); *G09G 3/3258* (2013.01); *G09G 3/3266* (2013.01); *G09G 3/3275* (2013.01); *H01L 27/323* (2013.01); *H01L 27/3262* (2013.01); *H01L 27/3265* (2013.01); *H01L 27/3276* (2013.01); *G06F 3/041* (2013.01); *G06F 2203/04103* (2013.01); *G09G 2300/0426* (2013.01); *G09G 2320/0204* (2013.01); *H01L 27/1251* (2013.01); *H01L 29/78645* (2013.01); *H01L 29/78696* (2013.01)

(58) Field of Classification Search
CPC .. G09G 3/3233; G09G 3/3266; G09G 3/3275; G09G 3/3258; H01L 27/3262; H01L 27/323; H01L 27/3276
See application file for complete search history.

(56) References Cited

U.S. PATENT DOCUMENTS

2016/0322449 A1* 11/2016 Pyon .................... H01L 27/3276
2017/0200742 A1*  7/2017 Shin ...................... H01L 27/127
(Continued)

*Primary Examiner* — Kwang-Su Yang
(74) *Attorney, Agent, or Firm* — Kilpatrick Townsend & Stockton, LLP

(57) ABSTRACT

A pixel driving circuit, a driving method and an organic light-emitting display panel are provided. The pixel driving circuit includes: a first transistor, a second transistor, a third transistor, a fourth transistor and a fifth transistor, a sixth transistor, a seventh transistor and an eighth transistors, and a capacitor. A first node is present between the fourth transistor and the fifth transistor. The seventh transistor is coupled between a reference voltage line and the first node, and the eighth transistor is coupled between the reference voltage line and an anode of the light-emitting element.

13 Claims, 11 Drawing Sheets

(51) Int. Cl.
    *G09G 3/3275*      (2016.01)
    *G09G 3/3258*      (2016.01)
    *G09G 3/3266*      (2016.01)
    *G06F 3/041*      (2006.01)
    *H01L 27/12*      (2006.01)
    *H01L 29/786*      (2006.01)

(56) References Cited

U.S. PATENT DOCUMENTS

| | | | |
|---|---|---|---|
| 2017/0249882 A1* | 8/2017 | Lee | G09G 3/006 |
| 2017/0308199 A1* | 10/2017 | Liu | G06F 3/044 |
| 2018/0033370 A1* | 2/2018 | Zheng | G09G 3/3233 |
| 2018/0040682 A1* | 2/2018 | Ebisuno | H01L 27/3262 |
| 2018/0122298 A1* | 5/2018 | Lee | G09G 3/3233 |
| 2018/0151118 A1* | 5/2018 | Chung | G09G 3/3233 |
| 2018/0158407 A1* | 6/2018 | Chai | G09G 3/3233 |

\* cited by examiner

PIXEL DRIVING CIRCUIT AND DRIVING METHOD THEREFOR, AND ORGANIC LIGHT-EMITTING DISPLAY PANEL

CROSS-REFERENCE TO RELATED APPLICATIONS

This application claims priority to Chinese Patent Application No. 201611178132.9, filed on Dec. 19, 2016 and entitled "PIXEL DRIVING CIRCUIT, DRIVING METHOD AND ORGANIC LIGHT-EMITTING DISPLAY PANEL", the disclosure of which is incorporated herein by reference in its entirety.

TECHNICAL FIELD

The present disclosure relates to the field of display technologies, and in particular, to a pixel driving circuit, a driving method and an organic light-emitting display panel.

BACKGROUND

Among the display technologies, Organic Light-Emitting Diode (OLED) is regarded in the industry as the third-generation display technology subsequent to Liquid Crystal Display (LCD) due to its advantages of a thin and light characteristic, active luminescence, fast response speed, wide visual angle, abundant colors, high brightness, low power consumption, high and low temperature resistance and the like.

At present, OLED displays are mainly displays that emit light under the control of electric current, and the luminescence uniformity is controlled by the corresponding electric current. However, because the threshold voltage of the drive transistor of each pixel of the OLED display tends to be drifted over time, the electric current passing through the OLED will be deviated under the same data signal, which causes non-uniform brightness in displaying. Further, the luminous efficiency of the OLED device itself will degrade over time, and thus the brightness will be lowered under the same electric current, thereby lowering the display effect of the display.

SUMMARY

In view of this, the disclosure provides a pixel driving circuit, a driving method and an organic light-emitting display panel, thereby solving the problem in the related art that the non-uniform display is present due to threshold voltage drifting and device degradation, etc.

In one aspect, the disclosure provides a pixel driving circuit, which includes: a first transistor, for delivering a power voltage to the pixel driving circuit in response to a signal from a light-emitting signal line; a second transistor, for delivering a data signal voltage to the pixel driving circuit in response to a signal from a first scanning line; a third transistor, for generating a drive current according to the data signal voltage; a fourth transistor and a fifth transistor, for detecting and self-compensating for the threshold voltage deviation of the third transistor; a sixth transistor, for controlling the drive current of the third transistor to be delivered to a light-emitting element in response to the signal from the light-emitting signal line; a seventh transistor and an eighth transistor, for delivering a reference voltage to the pixel driving circuit in response to a signal from a second scanning line; and a capacitor, for storing the data signal voltage delivered to the third transistor, wherein, a first node is present between the fourth transistor and the fifth transistor; the seventh transistor is coupled in series between a reference voltage line and the first node, and the eighth transistor is coupled in series between the reference voltage line and an anode of the light-emitting element.

In one aspect, the disclosure provides a driving method for driving the above pixel driving circuit, where the driving method includes a first reset phase, a second reset phase, a threshold compensation phase and a light-emitting phase: in the first reset phase, a first level signal is transferred on the second scanning line, a second level signal is transferred on the first scanning line and the light-emitting signal line, the pixel driving circuit performs resetting on the anode of the light-emitting element; in the second reset phase, the first level signal is transferred on the first scanning line and the second scanning line, the second level signal is transferred on the light-emitting signal line, and the pixel driving circuit performs resetting on the gate electrode of the drive transistor; in the threshold compensation phase, the first level signal is transferred on the first scanning line, the second level signal is transferred on the second scanning line and the light-emitting signal line, the pixel driving circuit performs compensation for the threshold of the drive transistor; and in the light-emitting phase, the first level signal is transferred on the light-emitting signal line, the second level signal is transferred on the first scanning line and the second scanning line, and the pixel driving circuit emits light.

In one aspect, the disclosure further provides an organic light-emitting display panel, which includes: a plurality of rows of pixel units, wherein each row of pixel units include a plurality of the above pixel driving circuits.

In comparison with the related art, the disclosure at least has one of the following outstanding advantages:

The problem of non-uniform display due to the threshold voltage drift of the drive transistor in the pixel driving circuit is solved by internal compensation; furthermore, it alleviates the problem of the related art that leakage current tends to be generated due to the large voltage difference at the two ends of the switch transistor in a light-emitting phase which is used for initialization, thereby causing the potential the gate electrode of the drive transistor to be unstable and hence causes non-uniform display.

BRIEF DESCRIPTION OF THE DRAWINGS

In order to more clearly illustrate the technical solutions of the embodiments of the present invention or of the related art, the drawings needed in the description of the embodiments or the related art will be briefly introduced below. Apparently, the drawings in the description below are only some embodiments of the disclosure, and other drawings may also be obtained by one of ordinary skills in the art according to these drawings without creative work.

DETAILED DESCRIPTION

In order to make the objects, technical solutions and advantages of the disclosure more apparent, the disclosure will be further illustrated in detail below in conjunction with the drawings and embodiments.

It needs to be noted that, for fully understanding the disclosure, specific details are set forth in the description below. However, the disclosure can be implemented in various modes other than those described herein, and one skilled in the art can make similar extensions without departing from the contents of the disclosure. Therefore, the disclosure will not be limited to the specific implementation modes disclosed below.

Figure 1A:
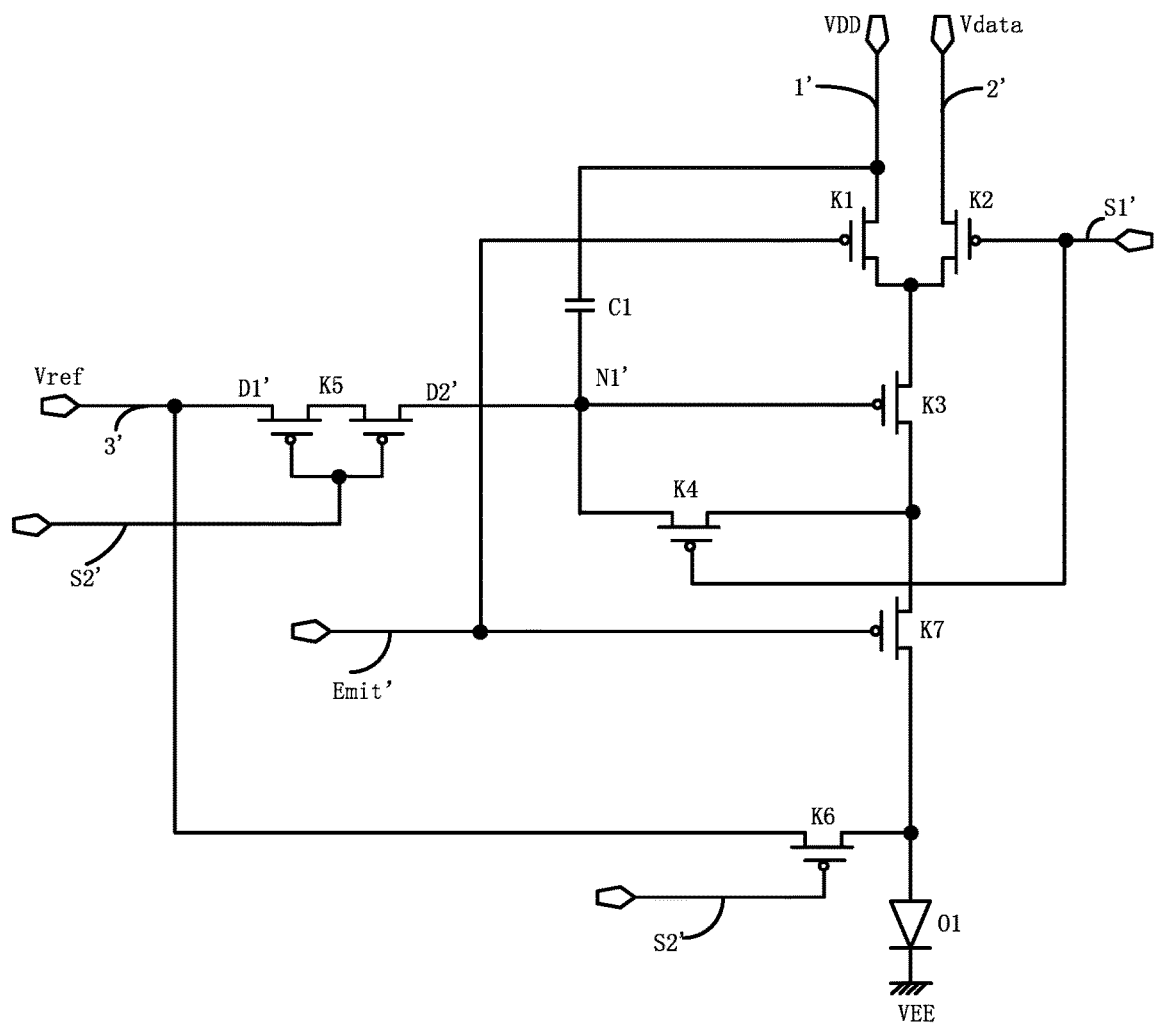
FIG. 1A is a schematic diagram of a pixel driving circuit according to the related art.
Figure 1B:
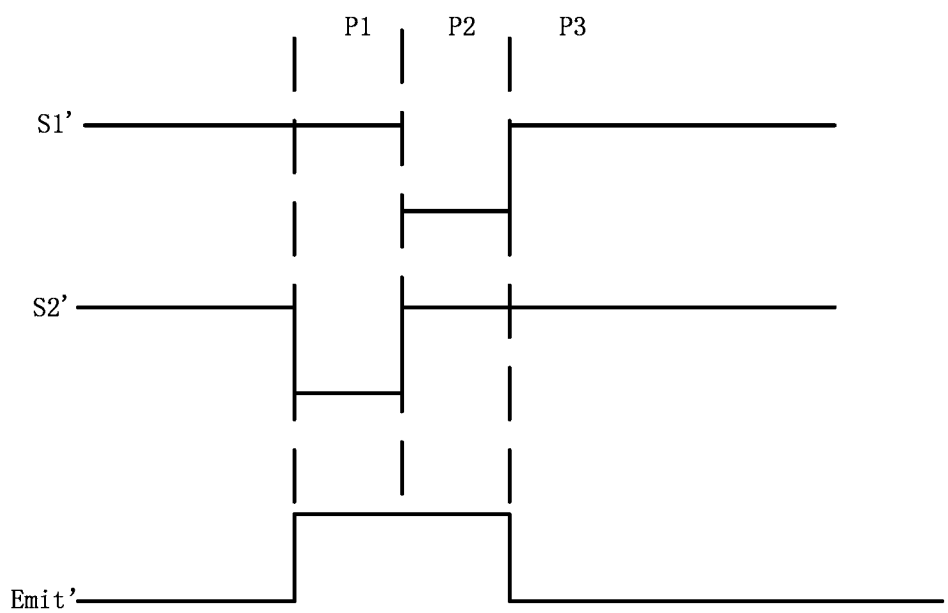
FIG. 1B is a schematic diagram showing the driving timing of the pixel driving circuit shown in FIG. 1A.

Reference is made to FIG. 1A and FIG. 1B, where FIG. 1A is a pixel driving circuit diagram according to the related art, and FIG. 1B is a driving timing diagram of the pixel driving circuit shown in FIG. 1A. As shown in FIG. 1A, the pixel driving circuit includes a first transistor K1, a second transistor K2, a third transistor K3, a fourth transistor K4, a fifth transistor K5, a sixth transistor K6, a seventh transistor K7, a capacitor C1 and a light-emitting element O1. A gate electrode of the first transistor K1 is electrically connected with a light-emitting signal line Emit', a first electrode of the first transistor K1 is electrically connected with a power voltage signal line 1', a second electrode of the first transistor K1 is electrically connected with a source electrode of the third transistor K3, a gate electrode of the second transistor K2 is electrically connected with a first scanning line S1', a first electrode of the second transistor K2 is electrically connected with a data line 2', a second electrode of the second transistor K2 is electrically connected with the source electrode of the third transistor K3, a gate electrode of the fourth transistor K4 is electrically connected with the first scanning line S1', the first electrode of the fourth transistor K4 is electrically connected with a second electrode of the fifth transistor K5 at a first node N1', a second electrode of the fourth transistor K4 is electrically connected with a gate electrode of the third transistor K3, a gate electrode of the fifth transistor K5 is electrically connected with a second scanning line S2', a first electrode of the fifth transistor K5 is electrically connected with a reference voltage line 3', a second electrode of the fifth transistor K5 is electrically connected with the gate electrode of the third transistor K3, a gate electrode of the sixth transistor K6 is electrically connected with the second scanning line S2', a first electrode of the sixth transistor K6 is electrically connected with the reference voltage line 3', a second electrode of the sixth transistor K6 is electrically connected with an anode of the light-emitting element O1, one end of the capacitor C1 is electrically connected with the power voltage signal line 1', and the other end of the capacitor C1 is electrically connected with the gate electrode of the third transistor K3. The third transistor K3 is a drive transistor, and the first transistor K1 to the sixth transistor K6 are all PMOS transistors.

It is known in conjunction with the driving timing shown in FIG. 1B that, the working phase of the pixel driving circuit is divided into a first phase P1, a second phase P2 and a third phase P3.

In the first phase P1, the second scanning line S2' transfers a low level signal, the first scanning line S1' and the light-emitting signal line Emit' transfer a high level signal, and hence, in the phase P1, the fifth transistor K5 and the sixth transistor K6 are turned on, the reference voltage line 3' delivers a reference voltage to the gate electrode of the drive transistor K3 via the fifth transistor K5 that is turned on and delivers the reference voltage to the anode of the light-emitting element O1 via the sixth transistor K6 that is turned on. Therefore, in the phase P1, the pixel driving circuit performs the initialization for gate electrode of the drive transistor and the initialization for the anode of the light-emitting element.

In the second phase P2, the second scanning line S2' and the light-emitting signal line Emit' transfer a high level signal, the first scanning line S1' transfers a low level signal, and hence, in the phase P2, the second transistor K2 and the fourth transistor K4 are turned on, and the third transistor K3 is turned on in this phase after being initialized in the phase P1. The data signal voltage on the data line 2' is continuously transferred on the gate electrode of the drive transistor K3 via the second transistor K2, the third transistor K3 and the fourth transistor K4 that are all turned on, and the drive transistor K3 is cut off after the potential of the gate electrode of the drive transistor K3 rises to Vdata-Vth, where Vdata is the data signal voltage, and Vth is the threshold voltage of the drive transistor K3. Therefore, in the phase P2, the pixel driving circuit performs the compensation for the threshold of the drive transistor K3.

In the third phase P3, the first scanning line S1' and the second scanning line S2' transfer a high level signal, the light-emitting signal line Emit' transfers a low level signal, and hence, in the phase P3, the first transistor K1 and the seventh transistor K7 are both turned on. Therefore, in the phase P3, the light-emitting element O1 emits light.

It is known from the above analysis that, in the light-emitting phase (P3), the voltage at one end D1' of the fifth transistor K5 is the reference voltage Vref, and the voltage at the other end D2' is Vdata-Vth, and generally, Vref is about −3V, Vdata-Vth is about 5.5V, so that the voltage difference (Vdata-Vth-Vref) between the two ends of the fifth transistor K5 is about 8V. That is, the step voltage formed between the two ends of the fifth transistor K5 is very large. Therefore, a certain leakage current would be present on the fifth transistor K5, which causes the potential of the first node N1' to be very unstable and the normal display would be affected. Moreover, due to variations in a manufacturing process for manufacturing different pixel driving circuits, the properties of the thin-film transistors may also be different. Therefore, the leakage current of the fifth transistor K5 of different pixel driving circuits will also be different, so that with respect to the first nodes N1' of different pixel driving circuits, the potentials thereof are largely different. As a result, the display of the whole picture will be non-uniform.

Figure 2A:
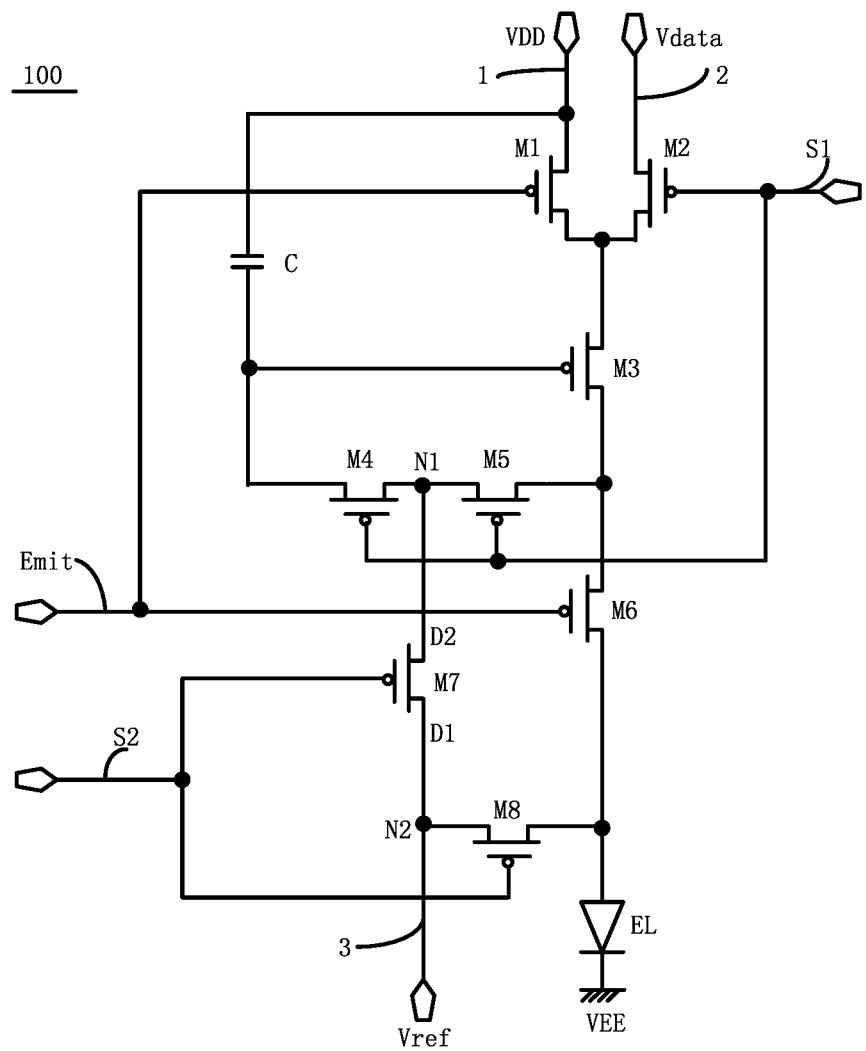
FIG. 2A is a schematic diagram of a pixel driving circuit according to an embodiment of the present invention.
Figure 2B:
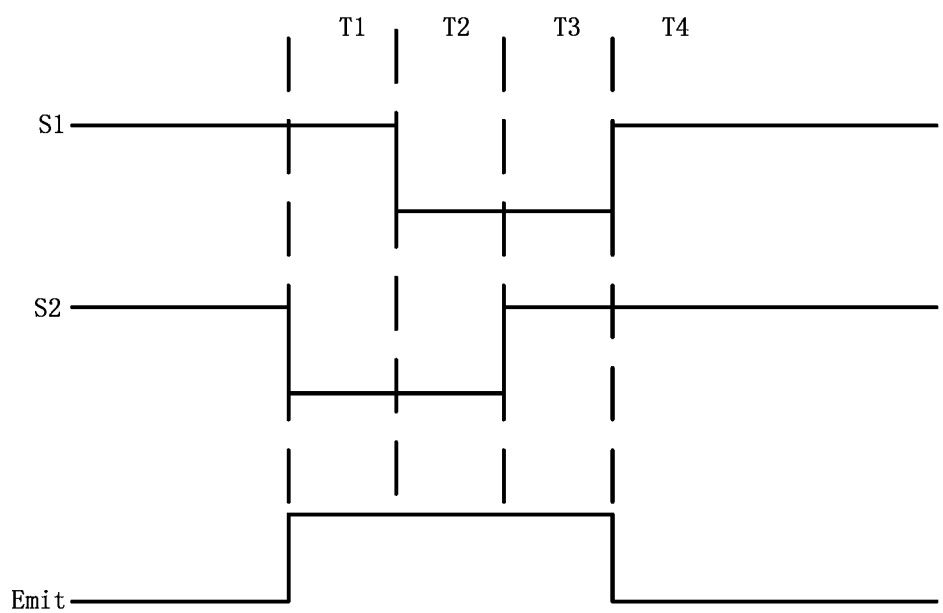
FIG. 2B is a schematic diagram showing the driving timing of the pixel driving circuit shown in FIG. 2A.

Reference is made to FIG. 2A and FIG. 2B, where FIG. 2A is a pixel driving circuit diagram according to an embodiment of the present invention, and FIG. 2B is a driving timing diagram of the pixel driving circuit shown in FIG. 2A. As shown in FIG. 2A, the pixel driving circuit includes a first transistor M1, a second transistor M2, a third transistor M3, a fourth transistor M4, a fifth transistor M5, a sixth transistor M6, a seventh transistor M7, a capacitor C and a light-emitting element EL. a gate electrode of the first transistor M1 is electrically connected with a light-emitting signal line Emit, a first electrode of M1 is electrically connected with a power voltage signal line 1, a second electrode of M1 is electrically connected with a source electrode of the third transistor M3, a gate electrode of the second transistor M2 is electrically connected with a first scanning line S1, a first electrode of M2 is electrically connected with a data line 2, a second electrode of M2 is electrically connected with the source electrode of the third transistor M3, a gate electrode of the fourth transistor M4 is electrically connected with the first scanning line S1, a first electrode of M4 is electrically connected with a second electrode of the fifth transistor M5 at a first node N1, a second electrode of M4 is electrically connected with a gate electrode of the third transistor M3, a gate electrode of the fifth transistor M5 is electrically connected with the first scanning line S1, a first electrode of the fifth transistor M5 is electrically connected with a drain electrode of the third transistor M3, a gate electrode of the sixth transistor M6 is electrically connected with the light-emitting signal line Emit, a first electrode of the sixth transistor M6 is electrically connected with the drain electrode of the third transistor M3, the second electrode of the sixth transistor M6 is electrically connected with an anode of the light-emitting element EL, a gate electrode of the seventh transistor M7 is electrically connected with a second scanning line S2, a first electrode of the seventh transistor M7 is electrically connected with a reference voltage line 3, a second electrode of the seventh transistor M7 is electrically connected with the first node N1, a gate electrode of the eighth transistor M8 is electrically connected with the second scanning line S2, a first electrode of the eighth transistor M8 is electrically connected with the reference voltage line 3, a second electrode of the eighth transistor M8 is electrically connected with the anode of the light-emitting element EL, one end of the capacitor C is electrically connected with the power voltage signal line 1, the other end of C is electrically connected with the gate electrode of the third transistor M3.

As shown in FIG. 2A, the fourth transistor M4 and the fifth transistor M5 are coupled in series between the gate electrode and the drain electrode of the third transistor M3, and the first node N1 is present between the fourth transistor M4 and the fifth transistor M5. The gate electrodes of the seventh transistor M7 and the eighth transistor M8 are both electrically connected with the second scanning line S2, and the first electrodes of the seventh transistor M7 and the eighth transistor M8 are both electrically connected with the reference voltage line. The seventh transistor M7 is coupled in series between the reference voltage line 3 and the first node N1, the eighth transistor M8 is coupled in series between the reference voltage line 3 and the anode of the light-emitting element EL.

In the embodiments of the present invention, the first transistor M1 is configured to deliver a power voltage VDD to the pixel driving circuit in response to a signal from the light-emitting signal line; the second transistor M2 is configured to deliver a data signal voltage Vdata to the pixel driving circuit in response to a signal from the first scanning line S1; the third transistor M3 is configured to generate a drive current according to the data signal voltage; the fourth transistor M4 and the fifth transistor M5 are configured to detect and self-compensate for the deviation of the threshold voltage of the third transistor; the sixth transistor M6 is configured to control the drive current of the third transistor to be delivered to a light-emitting element in response to a signal from the light-emitting signal line; the seventh transistor M7 and the eighth transistor M8 are configured to deliver a reference voltage Vref to the pixel driving circuit in response to a signal from the second scanning line S2. That is, in the embodiment of the present invention, the third transistor M3 is a drive transistor, and a structure similar to a diode (for example, the connection mode of M3, M4 and M5 shown in FIG. 2A, wherein, the gate electrode of M3 is connected with the second electrode of M4, the first electrode of M4 is connected with the second electrode of M5, and the first electrode of M5 is connected with the drain electrode of M3) is employed to make the compensation for the threshold of the drive transistor, and the switch transistor for initialization of the gate electrode of the drive transistor is set between the reference voltage line and the first node (the series node of M4 and M5). The advantages of such a design lies in that, on one hand, the problem of non-uniform display due to drift of the threshold of the drive transistor may be solved, and on the other hand, it alleviates the problem of the related art that, leakage current tends to be generated due to the large voltage difference at the two ends of the switch transistor in a light-emitting phase which is used for initialization, thereby causing the potential the gate electrode of the drive transistor to be unstable and hence causes non-uniform display.

The working process of the present invention and the positive effect thereof will be illustrated in detail below in conjunction with the driving method shown in FIG. 2B. As shown in FIG. 2B, the driving method includes a first reset phase T1, a second reset phase T2, a threshold compensation phase T3 and a light-emitting phase T4. It should be noted that, in the embodiments of the present invention, the first transistor M1 to the eighth transistor M8 are all PMOS transistors, and the first levels depicted in regard to FIG. 2B below are all low levels, and the second levels are all high levels. However, it is not limited in the disclosure, and when the first transistor M1 to the eighth transistor M8 are all NMOS transistors, the first levels depicted in regard to FIG. 2B below are high levels, and the second levels are low levels.

In the first reset phase T1, a first level signal is transferred on the second scanning line S2, a second level signal is transferred on the first scanning line S1 and the light-emitting signal line Emit. Therefore, the seventh transistor M7 and the eighth transistor M8 are turned on, the reference voltage line 3 transfers a reference voltage Vref to the first node N1 and the anode of the light-emitting element EL respectively; that is, the pixel driving circuit performs resetting on the anode of the light-emitting element EL.

In the second reset phase T2, a first level signal is transferred on the first scanning line S1 and the second scanning line S2, and a second level signal is transferred on the light-emitting signal line Emit. Therefore, the seventh transistor M7 and the fourth transistor M4 are turned on, and the reference voltage line 3 transfers the reference voltage Vref to the gate electrode of the drive transistor M3. Furthermore, in this phase, the reference voltage line 3 continues the transfer of the reference voltage Vref to the anode of the light-emitting element EL so as to continue the initialization for the anode of the light-emitting element EL; moreover, in the beginning of this phase, the drive transistor M3 is not initialized but is kept being cut off, and in this case, the data signal voltage Vdata on the data line 3 cannot be transferred to the anode of the drive transistor M3 even if the second transistor M2 is turned on. Therefore, in the phase T2, the pixel driving circuit performs the initialization for the gate electrode of the drive transistor.

In the threshold compensation phase T3, a first level signal is transferred on the first scanning line S1, and a second level signal is transferred on the second scanning line S2 and the light-emitting signal line Emit. Therefore, the second transistor M2, the fourth transistor M4 and the fifth transistor M5 are turned on, and also, the drive transistor M3 is turned on after being initialized in the previous phase. Therefore, in this phase, the data line 2 continuously transfers the data signal voltage to the gate electrode of the drive transistor M3 until the gate voltage of the drive transistor M3 is Vdata-Vth, and then the drive transistor M3 is cut off. This phase is accomplished. Therefore, in the phase T3, the pixel driving circuit performs compensation for the threshold of the drive transistor and stores it via the capacitor C.

In the light-emitting phase T4, a first level signal is transferred on the light-emitting signal line Emit, and a second level signal is transferred on the first scanning line and the second scanning line. Therefore, the first transistor M1 and the sixth transistor M6 are turned on, the light-emitting element emits light, and the luminescence current $I=k*(PVDD-Vdata)^2$, wherein, k is a constant, and PVDD is the voltage signal transferred on the power voltage signal line 1. It may be known form the formula that, the luminescence current of the light-emitting element is not relative to the threshold voltage Vth of the drive transistor, that is, the problem of threshold drift is solved in the embodiments of the present invention.

It may be known from the above analysis that, the switch transistor M7 for the initialization of the drive transistor M3 has a voltage difference of Vdata-Vth-Vref at the two ends (D1 and D2) thereof in the light-emitting phase. Due to the presence of the fourth transistor M4 which would not be cut off in the light-emitting phase, even if there may be a leakage current flowing to the first node N1, such leakage current would not further flow to the gate electrode of the drive transistor M3. That is, the potential of the gate electrode of the drive transistor in the light-emitting phase will not be affected by the leakage current of the rest transistors, and hence the luminescence uniformity in the light-emitting phase can be fully guaranteed. Therefore, by the disclosure, it solves the problem of the related art (FIG. 1A) that display uniformity is affected by the leakage current due to a large step voltage at the two ends of the initialized switch transistor.

In the embodiments of the present invention, the width-length ratio of the drive transistor M3 is smallest among the width-length ratios of all the drive transistors in the whole pixel driving circuit 100, that is, the width-length ratio of the third transistor M3 is smaller than that of any one of the first transistor M1, the second transistor M2, the fourth transistor M4, the fifth transistor M5, the sixth transistor M6, the seventh transistor M7 and the eighth transistor M8, thereby ensuring that the size of the drive current passing through the drive transistor may meet the high brightness of the light-emitting element. Furthermore, in the embodiments of the present invention, in order to fully guarantee the stability of potential of the gate electrode of the drive transistor M3, the width-length ratio of the fourth transistor M4 is smaller than that of the rest transistors except for the drive transistor M3, that is, the width-length ratio of the fourth transistor M4 is smaller than that of any one of the first transistor M1, the second transistor M2, the fifth transistor M5, the sixth transistor M6, the seventh transistor M7 and the eighth transistor M8, and is larger than the width-length ratio of the third transistor M3.

It may be known in conjunction with FIGS. 2A and 2B and the analysis above that, in the embodiments of the present invention, the problem of threshold voltage drift is not only being solved, but also the problem that the potential of the gate electrode of the drive transistor is affected by the leakage current due to too large step voltage of the transistor may be avoided.

Figure 3:
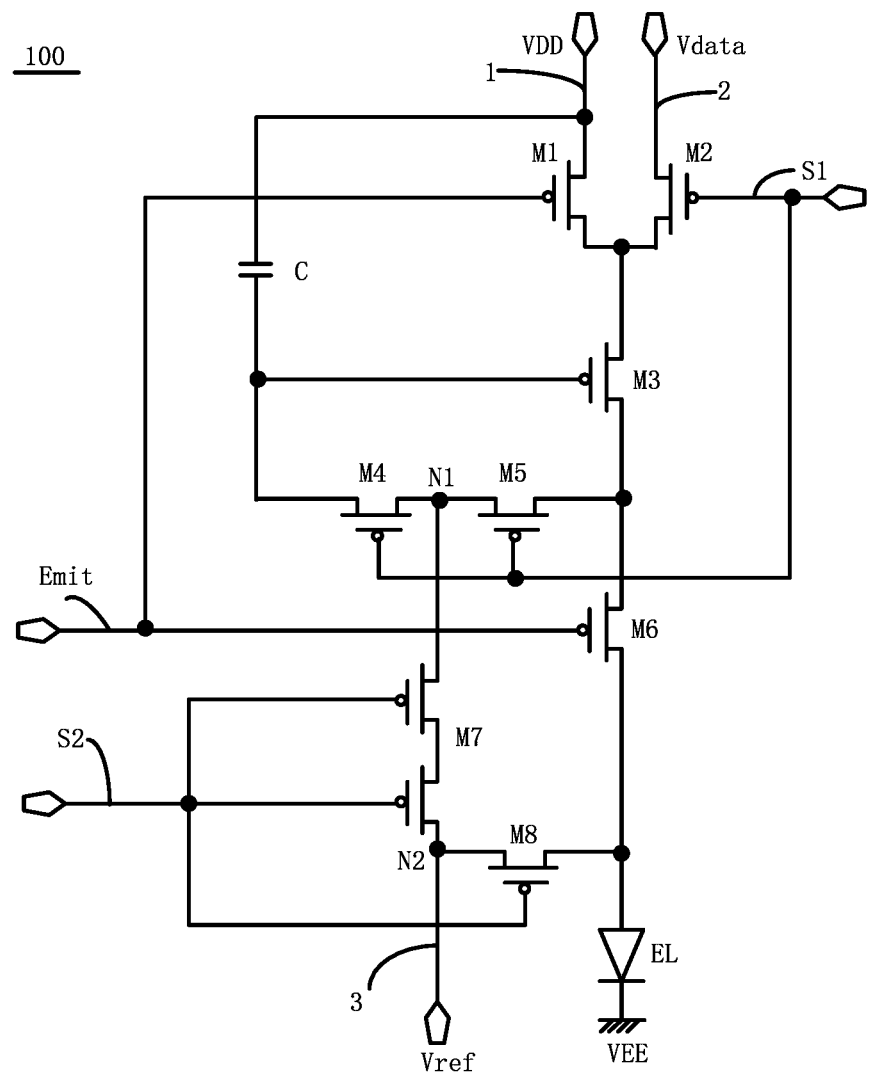
FIG. 3 is a schematic diagram of another pixel driving circuit according to an embodiment of the present invention.

Relative to the single-gate structure, the dual-gate structure has the advantages of strong breakdown resistance and reduced leakage current, etc. Therefore, an embodiment of the present invention further provides a pixel driving circuit diagram, as shown in FIG. 3. The same parts of the pixel driving circuit shown in FIG. 3 as that shown in FIG. 2A will not be described again here, and the main difference lies in that, in the embodiment shown in FIG. 3, the seventh transistor M7 has a dual-gate structure, so that it guarantees the stability of the first node N, thus improving the stability of the gate voltage of the drive transistor M3. Because the circuit structure in the embodiment shown in FIG. 3 has no essential difference on the connection relation from the circuit structure in the embodiment shown in FIG. 2A, the driving method shown in FIG. 2B is also applicable to the pixel driving circuit of the embodiment shown in FIG. 3, and hence the working process includes a first reset phase, a second reset phase, a threshold compensation phase and a light-emitting phase, and for the specific details thereof, reference may be made to the above description of the working process of the pixel driving circuit shown in FIG. 2A, which will not be described again here.

Figure 4A:
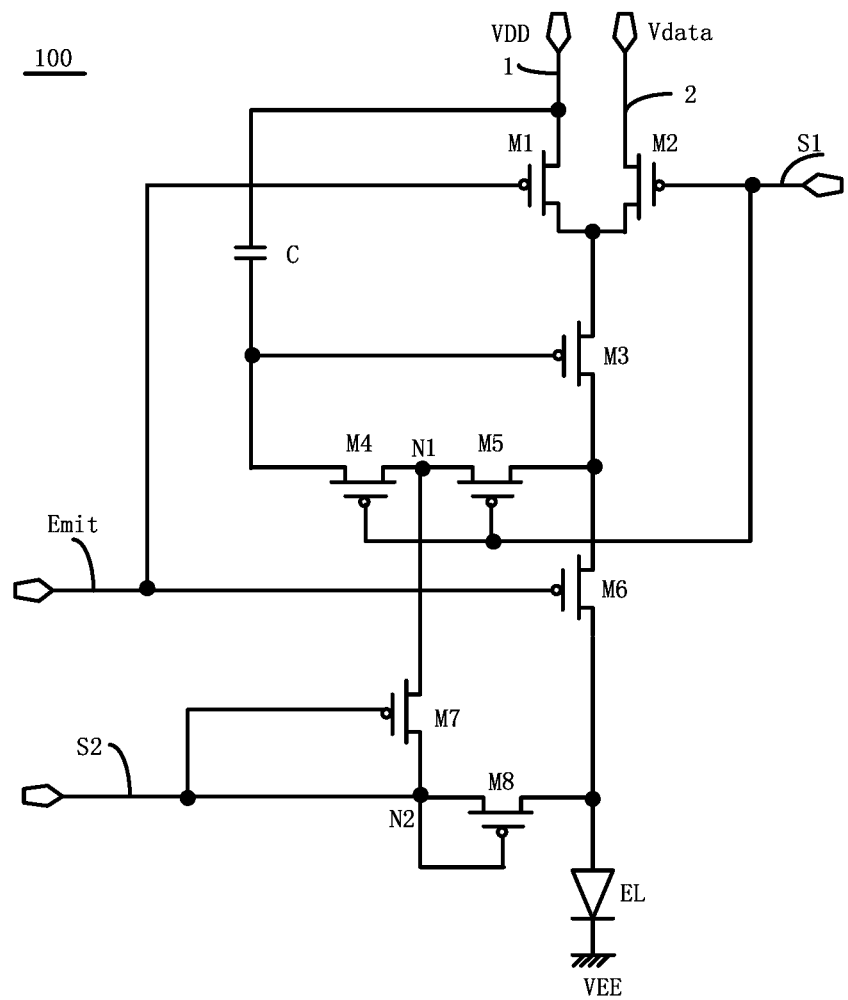
FIG. 4A is a schematic diagram of another pixel driving circuit according to an embodiment of the present invention.
Figure 4B:
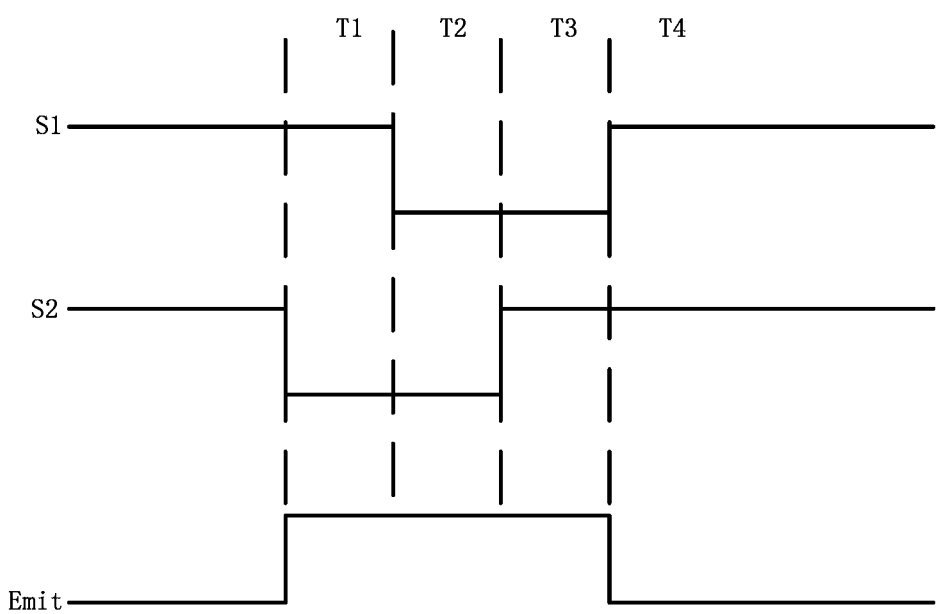
FIG. 4B is a schematic diagram showing the working timing of the pixel driving circuit shown in FIG. 4A.

FIG. 4A is a diagram showing another pixel driving circuit according to an embodiment of the present invention, and FIG. 4B is a working timing diagram of the pixel driving circuit shown in FIG. 4A. As shown in FIG. 4A, the pixel driving circuit includes a first transistor M1, a second transistor M2, a third transistor M3, a fourth transistor M4, a fifth transistor M5, a sixth transistor M6, a seventh transistor M7, a capacitor C and a light-emitting element EL. The gate electrode of the first transistor M1 is electrically connected with a light-emitting signal line Emit, a first electrode of the first transistor M1 is electrically connected with a power voltage signal line 1, a second electrode of the first transistor M1 is electrically connected with a source electrode of the third transistor M3, a gate electrode of the second transistor M2 is electrically connected with a first scanning line S1, a first electrode of the second transistor M2 is electrically connected with a data line 2, a second electrode of the second transistor M2 is electrically connected with the source electrode of the third transistor M3, a gate electrode of the fourth transistor M4 is electrically connected with the first scanning line S1, a first electrode of the fourth transistor M4 is electrically connected with a second electrode of the fifth transistor M5 at a first node N1, a second electrode of the fourth transistor M4 is electrically connected with a gate electrode of the third transistor M3, a gate electrode of the fifth transistor M5 is electrically connected with the first scanning line S1, a first electrode of the fifth transistor M5 is electrically connected with a drain electrode of the third transistor M3, a gate electrode of the sixth transistor M6 is electrically connected with the light-emitting signal line Emit, a first electrode of the sixth transistor M6 is electrically connected with the drain electrode of the third transistor M3, a second electrode of the sixth transistor M6 is electrically connected with an anode of the light-emitting element EL, a gate electrode of the seventh transistor M7 is connected with a first electrode of the seventh transistor M7 and is electrically connected with the second scanning line S2, a second electrode of M7 is electrically connected with the first node N1, a gate electrode of the eighth transistor M8 is connected with a first electrode of the eighth transistor M8 and is electrically connected to the second scanning line S2, and a second electrode of M8 is electrically connected with the anode of the light-emitting element EL.

In the embodiments of the present invention, the second scanning line S2 is multiplexed as the reference voltage line, and the scanning voltage transferred on the second scanning line S2 is multiplexed as the reference voltage Vref, so that the setting of the reference voltage source and the reference voltage line may be reduced in the pixel driving circuit.

As shown in FIG. 4B, the driving method for the pixel driving circuit according to the embodiments of the present invention includes a first reset phase T1, a second reset phase T2, a threshold compensation phase T3 and a light-emitting phase T4. It should be noted that, the specific working principles and technical effects will be illustrated only by an example in which the first transistor M1 to the eighth transistor M8 are all PMOS transistors, the first levels depicted in regard to FIG. 4B are all low levels, and the second levels are all high levels. However, it is not limited in the disclosure, and the first transistor M1 to the eighth transistor M8 may also be all NMOS transistors, the first levels depicted in regard to FIG. 4B are all high levels, and the second levels are all low levels.

In the first reset phase T1, a first level signal is transferred on the second scanning line S2, and a second level signal is transferred on the first scanning line S1 and the light-emitting signal line Emit. Therefore, the seventh transistor M7 and the eighth transistor M8 are turned on, and the second scanning line S2 transfers the first level signal on the second scanning line S2 (since PMOSs are shown as an example, the first level signal is a low level signal) to the first node N1 and the anode of the light-emitting element EL, respectively, that is, the pixel driving circuit performs resetting on the anode of the light-emitting element EL.

In the second reset phase T2, a first level signal is transferred on the first scanning line S1 and the second scanning line S2, and a second level signal is transferred on the light-emitting signal line Emit. Therefore, the seventh transistor M7 and the fourth transistor M4 are turned on, and the second scanning line S2 transfers the first level signal on the second scanning line S2 to the gate electrode of the drive transistor M3. Furthermore, in this phase, the second scanning line S2 continues the transfer of the first level signal on the second scanning line S2 to the anode of the light-emitting element EL so as to continue the initialization for the anode of the light-emitting element EL; moreover, at the beginning of this phase, the drive transistor M3 is not initialized but is kept being cut off, and in this case, the data signal voltage Vdata on the data line 3 cannot be transferred to the anode of the drive transistor M3 even if the second transistor M2 is turned on. Therefore, in the phase T2, the pixel driving circuit performs the initialization for the gate electrode of the drive transistor.

In the threshold compensation phase T3, a first level signal is transferred on the first scanning line S1, and a second level signal is transferred on the second scanning line S2 and the light-emitting signal line Emit. Therefore, the second transistor M2, the fourth transistor M4 and the fifth transistor M5 are turned on, and also, the drive transistor M3 is turned on after being initialized in the previous phase. Therefore, in this phase, the data line 2 continuously transfers the data signal voltage to the gate electrode of the drive transistor M3 until the gate voltage of the drive transistor M3 is Vdata-Vth, and then the drive transistor M3 is cut off. This phase is accomplished. Therefore, in the phase T3, the pixel driving circuit performs compensation for the threshold of the drive transistor and stores it via the capacitor C.

In the light-emitting phase T4, a first level signal is transferred on the light-emitting signal line Emit, and a second level signal is transferred on the first scanning line and the second scanning line. Therefore, the first transistor M1 and the sixth transistor M6 are turned on, the light-emitting element emits light, and the luminescence current $I=k*(PVDD-Vdata)^2$, wherein, k is a constant, and PVDD is the voltage signal transferred on the power voltage signal line 1. It is known form the formula that, the luminescence current of the light-emitting element is not relative to the threshold voltage Vth of the drive transistor, that is, the problem of threshold drift is solved in the embodiments of the present invention.

It may be known from the above analysis that, the switch transistor M7, which is used for the initialization of the drive transistor M3, has a voltage difference of Vdata-Vth-Vref at the two ends (D1 and D2) thereof in the light-emitting phase. Due to the presence of the fourth transistor M4 which would not be cut off in the light-emitting phase, even if there may be a leakage current flowing to the first node N1, such the leakage current would not further flow to the gate electrode of the drive transistor M3. That is, the potential of the gate electrode of the drive transistor in the light-emitting phase will not be affected by the leakage current of the rest transistors, and hence the luminescence uniformity in the light-emitting phase can be fully guaranteed. Therefore, by the disclosure, it solves the problem of the related art (FIG. 1A) that display uniformity is affected by the leakage current due to a large step voltage at the two ends of the initializated switch transistor. Further, in the pixel circuit structure according to this embodiment, no additional reference voltage line or reference voltage source needs to be provided, thereby saving wiring space in order to facilitate the design demand of a high-resolution and narrow-frame display.

In the embodiment of the present invention, the width-length ratio of the drive transistor M3 is likewise smallest among the width-length ratios of all the drive transistors in the whole pixel driving circuit 100, thereby ensuring that the size of the drive current passing through the drive transistor may meet the high brightness of the light-emitting element.

In the embodiment of the present invention, in order to fully guarantee the stability of the potential of the gate electrode of the drive transistor M3, the width-length ratio of the fourth transistor M4 is smaller than that of the rest transistors except for the drive transistor M3.

In the embodiment of the present invention, the seventh transistor M7 may be likewise designed as a dual-gate structure, in order to improve the stability of the potential of the gate electrode of the drive transistor.

Figure 4C:
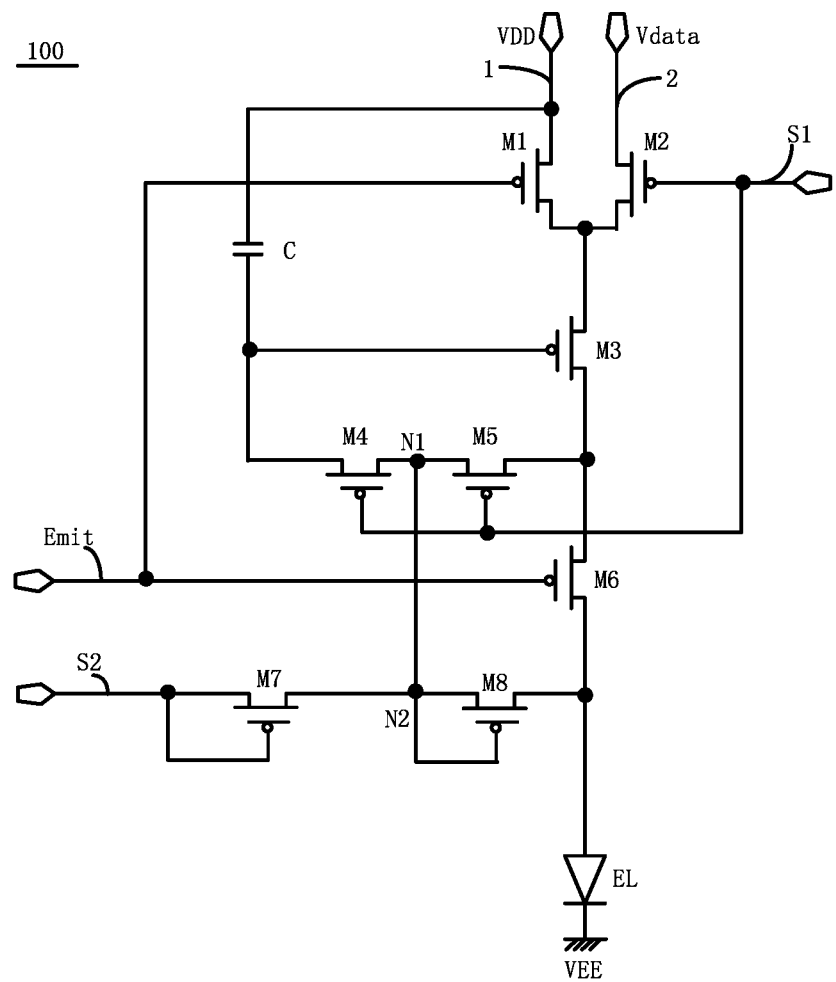
FIG. 4C is a schematic diagram of another pixel driving circuit according to an embodiment of the present invention.

In the embodiment of the present invention, the connection relation of the first transistor M1 to the seventh transistor M7 may also be changed to that of the pixel driving circuit as shown in FIG. 4C. The first transistor M1 to the seventh transistor M7 in FIG. 4C are consistent with those in FIG. 4A, and the main difference lies in that, in FIG. 4C, the gate electrode of the eighth transistor M8 is connected with the first electrode of the eighth transistor M8 and is electrically connected to the second electrode of the seventh transistor M7. Specifically, referring to FIG. 4C, the gate electrode of the first transistor M1 is electrically connected with the light-emitting signal line Emit, the first electrode of the first transistor M1 is electrically connected with power voltage signal line 1, the second electrode of the first transistor M1 is electrically connected with the source electrode of the third transistor M3, the gate electrode of the second transistor M2 is electrically connected with the first scanning line S1, the first electrode of the second transistor M2 is electrically connected with the data line 2, the second electrode of the second transistor M2 is electrically connected with the source electrode of the third transistor M3, the gate electrode of the fourth transistor M4 is electrically connected with the first scanning line S1, the first electrode of the fourth transistor M4 is electrically connected with the second electrode of the fifth transistor M5 at a first node N1, the second electrode of the fourth transistor M4 is electrically connected with the gate electrode of the third transistor M3, the gate electrode of the fifth transistor M5 is electrically connected with the first scanning line S1, the first electrode of the fifth transistor M5 is electrically connected with the drain electrode of the third transistor M3, the gate electrode of the sixth transistor M6 is electrically connected with the light-emitting signal line Emit, the first electrode of the sixth transistor M6 is electrically connected with the drain electrode of the third transistor M3, the second electrode of the sixth transistor M6 is electrically connected with the anode of the light-emitting element EL, the gate electrode of the seventh transistor M7 is connected with the first electrode of the seventh transistor M7 and is electrically connected with the second scanning line S2, the second electrode of the seventh transistor M7 is electrically connected with the first node N1, the gate electrode of the eighth transistor M8 is connected with the first electrode of the eighth transistor M8 and is electrically connected to the second electrode of the seventh transistor M7 (as shown by the node N2 in FIG. 4C), and the second electrode of the eighth transistor M8 is electrically connected with the anode of the light-emitting element EL.

The driving timing shown in FIG. 4B is likewise applicable to the pixel driving circuit of FIG. 4C, and it includes a first reset phase, a second reset phase, a threshold compensation phase and a light-emitting phase. The specific processes of these four phases are consistent with those of the pixel driving circuit shown in FIG. 4A, and the main difference lies in that, in the first reset phase and the second reset phase, the second scanning line S2 directly transfers the first level signal on the second scanning line S2 to the first electrode of the eighth transistor M8, rather than the configuration as shown in FIG. 4 that the first level signal on the second scanning line S2 is firstly transferred through the seventh transistor M7 and then transferred to the first electrode of the eighth transistor M8, thus ensuring that, when the first level signal on the second scanning line S2 flows to the anode of the light-emitting element, the voltage would not be too high.

By the pixel driving circuit shown in FIG. 4C, not only the problem of threshold voltage drift can be solved, but also it solves the problem of the related art (FIG. 1A) that display uniformity is affected by the leakage current due to a large step voltage at the two ends of the initialized switch transistor.

It can be seen from the above embodiments that, the driving methods thereof all includes the first reset phase, the second reset phase, the threshold compensation phase and the light-emitting phase. In the first reset phase, a first level signal is transferred on the second scanning line, a second level signal is transferred on the first scanning line and the light-emitting signal line, and the pixel driving circuit performs resetting on the anode of the light-emitting element; in the second reset phase, the first level signal is transferred on the first scanning line and the second scanning line, the second level signal is transferred on the light-emitting signal line, and the pixel driving circuit performs resetting on the gate electrode of the drive transistor; in the threshold compensation phase, the first level signal is transferred on the first scanning line, the second level signal is transferred on the second scanning line and the light-emitting signal line, and the pixel driving circuit performs compensation for the threshold of the drive transistor; and in the light-emitting phase, the first level signal is transferred on the light-emitting signal line, the second level signal is transferred on the first scanning line and the second scanning line, and the pixel driving circuit emits light.

An embodiment of the present invention further provides an organic light-emitting display panel, which includes a plurality of rows of pixel units, where each row of pixel units include a plurality of pixel driving circuits according to any one of the above embodiments. Specifically, referring to FIG. 5A, the organic light-emitting display panel 10 includes a plurality of rows of pixel units 112, and each row of pixel units 112 include a plurality of pixel driving circuits 100. Each row of pixel units 112 include a first scanning line S1 and a second scanning line S2, and the first scanning line of the $i^{th}$ row of pixel units is multiplexed as the second scanning line of the $i+1^{th}$ row of pixel units, where i is a positive integer. FIG. 5B is a schematic diagram showing the sectional structure along the sectional line A-A of FIG. 5A. As shown in FIG. 5B, the organic light-emitting display panel includes: a substrate 11; a buffer layer 112 located on the substrate; a thin-film transistor 113; insulating layers 114, 115 and 116; an anode layer 117; a cathode layer 119; a luminescent material layer 118 located between the anode layer 117 and the cathode layer 119, where the luminescent material layer 118 is partitioned into a plurality of light-emitting regions by a pixel defining layer 120; and a packaging layer 121 located on the cathode layer 119. In this embodiment, the substrate 111 may be a flexible substrate, for example, polyimide; or, it may be a rigid substrate, for example, glass; the packaging layer 121 includes a layer of organic film 1212 and two layers of inorganic films 1211, wherein the layer organic film 1212 is an elastically recoverable. It should be noted that, the number of the layers of organic films 1212 and the layers of inorganic films 1211 in the packaging layer 121 is not limited in this embodiment.

It should be noted that, in the embodiments of the present invention, the organic light-emitting display panel may also be integrated with a touch function according to practical requirements. As shown in FIG. 5C, a touch electrode layer 122 is provided on the layer of organic film 1212, and the touch electrode layer 122 is formed via ink-jet printing. Generally, after the touch electrode layer 122 is formed, it will be further covered with the layer of inorganic film 1211 for preventing water and oxygen from affecting on the performance of the whole packaging layer. Also, in the embodiments of the present invention, in order to improve the touch sensitivity of the organic light-emitting display panel, when touch electrodes are provided in the packaging layer, the elastic modulus of the layer of organic film 1212 should be smaller than or equal to 18 GPa.

It should be noted that, in the embodiments of the present invention, the orientations of "above", "under", "left" and "right", etc., are described in the view point show in the drawings, and they should not be construed as limiting the embodiments of the present invention. Additionally, it should also be understood in the context that, when one element is said to be formed "on" or "under" another element, it not only can be formed directly "on" or "under" said another element, but also can be formed indirectly "on" or "under" said another element via an intermediate element.

Figure 5A:
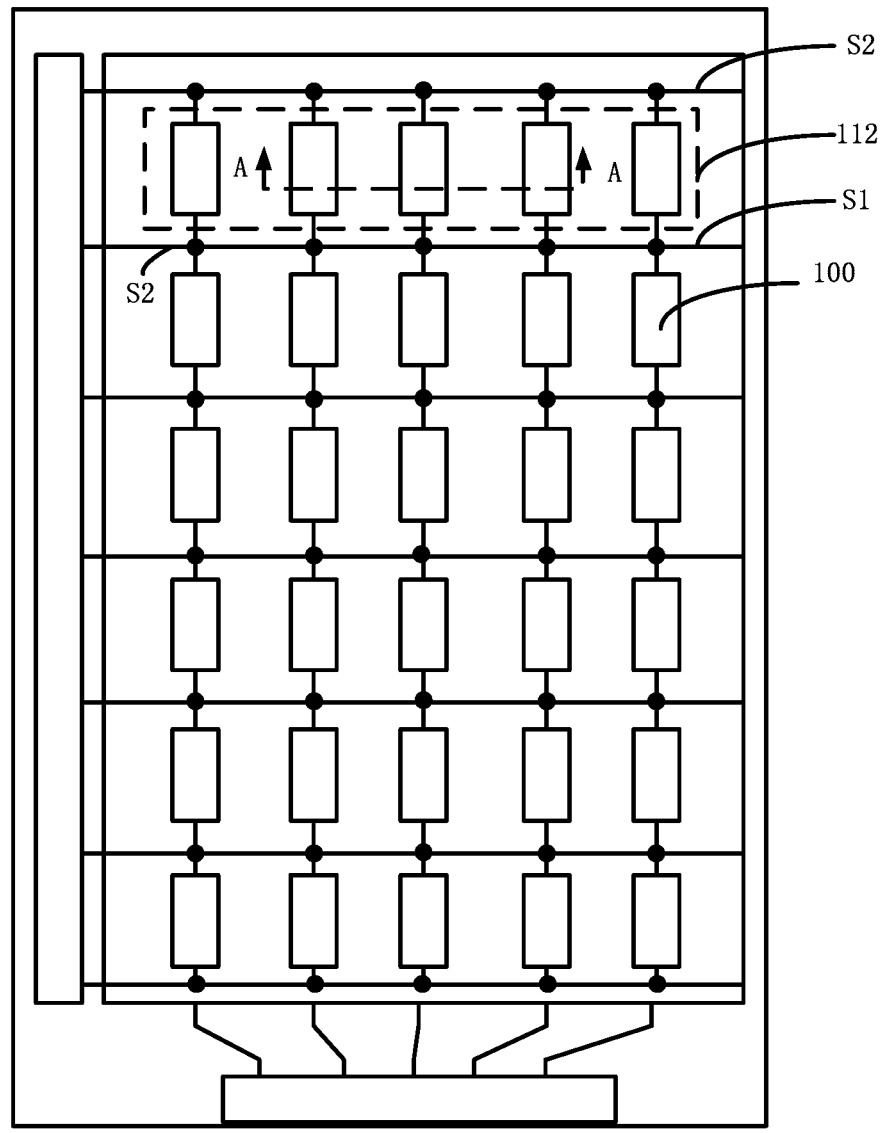
FIG. 5A is a structural representation of an organic light-emitting display panel according to an embodiment of the present invention.
Figure 5B:
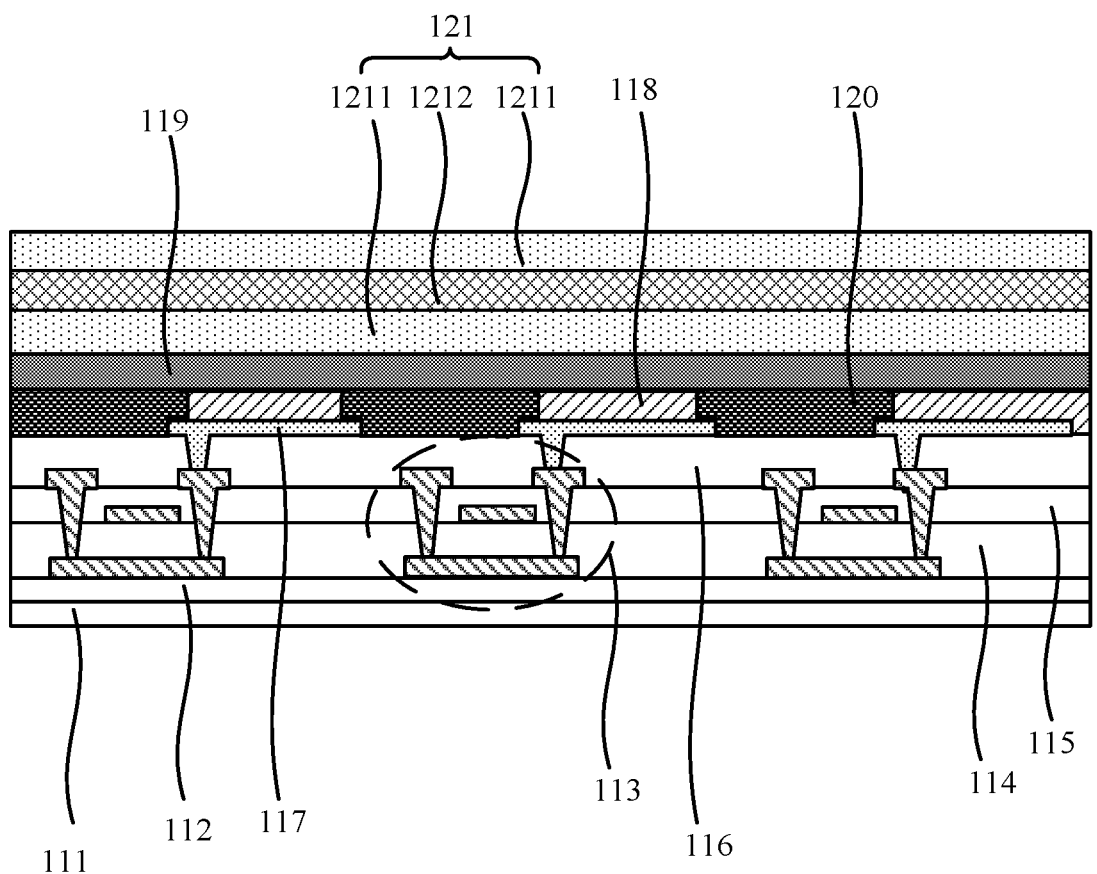
FIG. 5B is a schematic diagram showing the sectional structure along sectional line A-A of FIG. 5A.
Figure 5C:
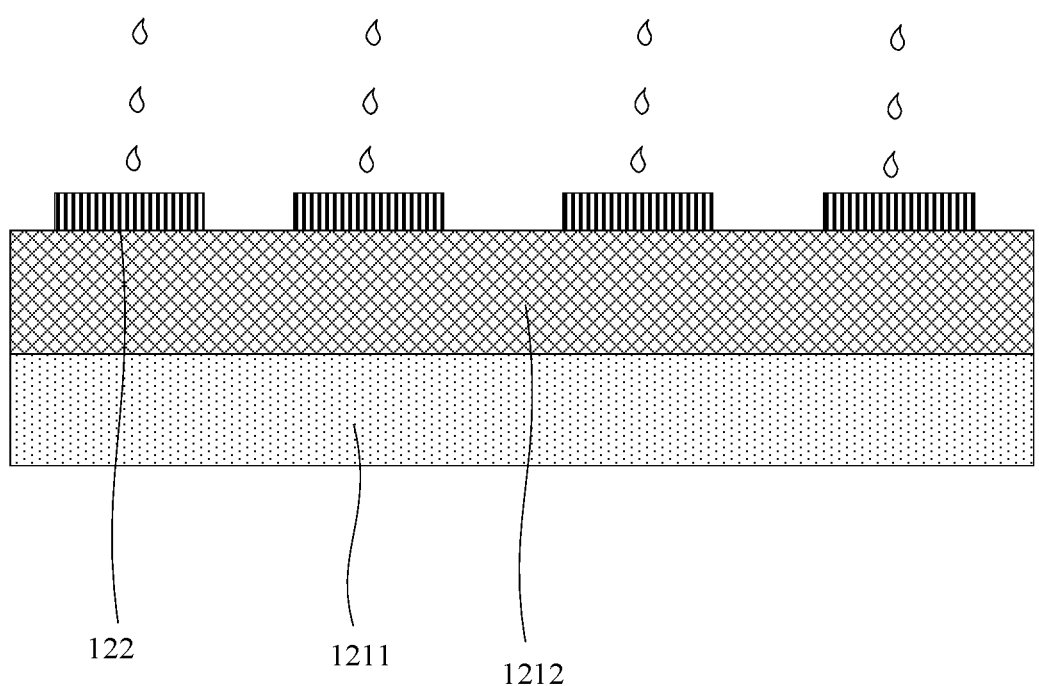
FIG. 5C is a structural representation showing the touch electrode of the organic light-emitting display panel shown in FIG. 5A.

It should be noted that, in addition to the components shown and described in FIG. 5A and FIG. 5B, the organic light-emitting display panel may further include some necessary structures such as an integrated circuit IC and a signal line, etc. This is a common knowledge in the art, and will not be described again here.

The above contents are further detailed illustrations of the disclosure in conjunction with specific preferred embodiments, and the specific implementation of the disclosure should not be regarded as being limited thereto. For one of ordinary skills in the art, several simple deductions or substitutions may also be made without departing from the concept of the disclosure, and all these deductions or substitutions should be construed as falling into the protection scope of the disclosure.

What is claimed is:

1. A pixel driving circuit, comprising:
   a first transistor, for delivering a power voltage to the pixel driving circuit in response to a signal from a light-emitting signal line;
   a second transistor, for delivering a data signal voltage to the pixel driving circuit in response to a signal from a first scanning line;
   a third transistor, for generating a drive current according to the data signal voltage;
   a fourth transistor and a fifth transistor, for detecting and self-compensating for the threshold voltage deviation of the third transistor;
   a sixth transistor, for controlling the drive current of the third transistor to be delivered to the light-emitting element in response to the signal from the light-emitting signal line;
   a seventh transistor and an eighth transistor, for delivering a reference voltage to the pixel driving circuit in response to a signal from a second scanning line; and
   a capacitor, for storing the data signal voltage delivered to the third transistor,
   wherein
   a first node is presented between the fourth transistor and the fifth transistor, and
   the seventh transistor is coupled between a reference voltage line and the first node, and the eighth transistor is coupled between the reference voltage line and an anode of the light-emitting element.

2. The pixel driving circuit according to claim 1, wherein the fourth transistor and the fifth transistor are coupled between a gate electrode and a drain electrode of the third transistor.

3. The pixel driving circuit according to claim 2, wherein gate electrodes of the seventh transistor and the eighth transistor are both electrically connected with the second scanning line, and first electrodes of the seventh transistor and the eighth transistor are both electrically connected with the reference voltage line.

4. The pixel driving circuit according to claim 3, wherein a gate electrode of the first transistor is electrically connected with the light-emitting signal line, a first electrode of the first transistor is electrically connected with the power voltage signal line, a second electrode of the first transistor is electrically connected with a source electrode of the third transistor, a gate electrode of the second transistor is electrically connected with the first scanning line, a first electrode of the second transistor is electrically connected with the data line, a second electrode of the second transistor is electrically connected with the source electrode of the third transistor, a gate electrode of the fourth transistor is electrically connected with the first scanning line, a first electrode of the fourth transistor is electrically connected with a second electrode of the fifth transistor at the first node, a second electrode of the fourth transistor is electrically connected with the gate electrode of the third transistor, a gate electrode of the fifth transistor is electrically connected with the first scanning line, a first electrode of the fifth transistor is electrically connected with the drain electrode of the third transistor, a gate electrode of the sixth transistor is electrically connected with the light-emitting signal line, a first electrode of the sixth transistor is electrically connected with the drain electrode of the third transistor, a second electrode of the sixth transistor is electrically connected with the anode of the light-emitting element, a gate electrode of the seventh transistor is electrically connected with the second scanning line, a first electrode of the seventh transistor is electrically connected with the reference voltage line, a second electrode of the seventh transistor is electrically connected with the first node, a gate electrode of the eighth transistor is electrically connected with the second scanning line, a first electrode of the eighth transistor is electrically connected with the reference voltage line, a second electrode of the eighth transistor is electrically connected with the anode of the light-emitting element, one end of the capacitor is electrically connected with the power voltage signal line, and the other end of the capacitor is electrically connected with the gate electrode of the third transistor.

5. The pixel driving circuit according to claim 1, wherein a width-length ratio of the third transistor is less than a width-length ratio of any one of the first transistor, the second transistor, the fourth transistor, the fifth transistor, the sixth transistor, the seventh transistor and the eighth transistor.

6. The pixel driving circuit according to claim 5, wherein a width-length ratio of the fourth transistor is less than a width-length ratio of any one of the first transistor, the second transistor, the fifth transistor, the sixth transistor, the seventh transistor and the eighth transistor.

7. The pixel driving circuit according to claim 1, wherein the first transistor, the second transistor, the third transistor, the fourth transistor, the fifth transistor, the sixth transistor, the seventh transistor and the eighth transistor are all PMOS transistors or all NMOS transistors.

8. The pixel driving circuit according to claim 1, wherein the seventh transistor has a dual-gate structure.

9. An organic light-emitting display panel, comprising: a plurality of rows of pixel units, wherein each row of pixel units comprise a plurality of pixel driving circuits according to claim 1.

10. The organic light-emitting display panel according to claim 9, wherein
    each row of pixel units comprise a first scanning line and a second scanning line, and the first scanning line of the ith row of pixel units is multiplexed as the second scanning line of the i+1th row of pixel units, wherein i is a positive integer.

11. The organic light-emitting display panel according to claim 9, further comprising a packaging layer, wherein the packaging layer comprises a touch electrode.

12. The organic light-emitting display panel according to claim 11, wherein
    the touch electrode is formed via ink-jet printing.

13. A driving method, for driving the pixel driving circuit according to claim 1, the driving method comprising a first reset phase, a second reset phase, a threshold compensation phase and a light-emitting phase, in the first reset phase, transmitting a first level signal on the second scanning line, transmitting a second level signal is transmitted on the first scanning line and the light-emitting signal line, and accomplishing resetting on the anode of the light-emitting element by the pixel driving circuit;

in the second reset phase, transmitting the first level signal on the first scanning line and the second scanning line, transmitting the second level signal on the light-emitting signal line, and accomplishing resetting on the gate electrode of the drive transistor by the pixel driving circuit;

in the threshold compensation phase, transmitting the first level signal on the first scanning line, transmitting the second level signal on the second scanning line and the light-emitting signal line, accomplishing the pixel driving circuit accomplishes compensation for the threshold of the drive transistor by the pixel driving circuit; and in the light-emitting phase, transmitting the first level signal on the light-emitting signal line, transmitting the second level signal on the first scanning line and the second scanning line, and the pixel driving circuit emits light.

* * * * *

UNITED STATES PATENT AND TRADEMARK OFFICE
CERTIFICATE OF CORRECTION

PATENT NO. : 10,276,094 B2
APPLICATION NO. : 15/464281
DATED : April 30, 2019
INVENTOR(S) : Dongxu Xiang et al.

It is certified that error appears in the above-identified patent and that said Letters Patent is hereby corrected as shown below:

On the Title Page

Item (73):
Please correct Assignee's name from Shanghai Tianma AM-OLEO Co., Ltd. to Shanghai Tianma AM-OLED Co., Ltd.

Signed and Sealed this
Eleventh Day of June, 2019

Andrei Iancu
*Director of the United States Patent and Trademark Office*